United States Patent
Kim et al.

(10) Patent No.: US 10,094,705 B2
(45) Date of Patent: Oct. 9, 2018

(54) APPARATUS AND METHOD FOR PROCESSING OUTPUT SIGNAL OF ANALOG-TO-DIGITAL CONVERTER

(71) Applicant: SOLiD, INC., Seongnam-si, Gyeonggi-do (KR)

(72) Inventors: Hyoungho Kim, Seoul (KR); Kwangnam Seo, Guri-si (KR); Doyoon Kim, Bucheon-si (KR)

(73) Assignee: SOLiD, INC., Seongnam-si (KR)

(*) Notice: Subject to any disclaimer, the term of this patent is extended or adjusted under 35 U.S.C. 154(b) by 0 days.

(21) Appl. No.: 15/540,494

(22) PCT Filed: Dec. 29, 2015

(86) PCT No.: PCT/KR2015/014450
§ 371 (c)(1),
(2) Date: Jun. 28, 2017

(87) PCT Pub. No.: WO2016/108601
PCT Pub. Date: Jul. 7, 2016

(65) Prior Publication Data
US 2017/0370766 A1 Dec. 28, 2017

(30) Foreign Application Priority Data
Dec. 29, 2014 (KR) ........................ 10-2014-0192229

(51) Int. Cl.
*H03M 1/66* (2006.01)
*G01G 23/10* (2006.01)
(Continued)

(52) U.S. Cl.
CPC .......... *G01G 23/10* (2013.01); *G01G 3/1414* (2013.01); *G06F 3/05* (2013.01); *H03D 7/125* (2013.01);
(Continued)

(58) Field of Classification Search
CPC ............ H03M 1/747; H04L 25/03038; H04L 27/2647; H03D 7/125; H03D 7/1441; H03H 2/006; H04B 1/0483
(Continued)

(56) References Cited

U.S. PATENT DOCUMENTS

| 4,998,960 A * | 3/1991 | Rose .................... G10H 1/0008 84/602 |
| 2006/0045221 A1* | 3/2006 | Sasson ................ H04L 25/0307 375/350 |

(Continued)

FOREIGN PATENT DOCUMENTS

| JP | 2000-236268 A | 8/2000 |
| JP | 2011-206287 A | 10/2011 |

(Continued)

OTHER PUBLICATIONS

International Search Report for PCT/KR2015/014450 dated Apr. 29, 2016.
(Continued)

*Primary Examiner* — Joseph Lauture
(74) *Attorney, Agent, or Firm* — Sughrue Mion, PLLC

(57) ABSTRACT

According to an aspect of the inventive concept, there is provided an apparatus for processing an output signal of an analog-digital converter, includes: a first frequency conversion unit for converting a frequency of the output signal of the analog-digital converter so that a band where spurious components exist moves to a band where direct current components exist in the output signal of the analog-digital converter; a spurious component blocking unit for eliminating, from an output signal of the first frequency conversion unit, spurious components which have moved to the band where direct current components exist; and a second frequency conversion unit for restoring a frequency of an output signal of the spurious component blocking unit to the original frequency of the output signal of the analog-digital converter.

10 Claims, 6 Drawing Sheets

(51) Int. Cl.
*G01G 3/14* (2006.01)
*G06F 3/05* (2006.01)
*H03D 7/14* (2006.01)
*H03D 7/12* (2006.01)
*H04L 27/26* (2006.01)
*H03M 1/74* (2006.01)
*H04L 25/03* (2006.01)
*H04B 1/04* (2006.01)

(52) U.S. Cl.
CPC ........... *H03D 7/1441* (2013.01); *H03M 1/747* (2013.01); *H04B 1/0483* (2013.01); *H04L 25/03038* (2013.01); *H04L 27/2647* (2013.01)

(58) Field of Classification Search
USPC ...... 341/144; 375/350, 316; 455/131, 114.1, 455/102, 323
See application file for complete search history.

(56) References Cited

U.S. PATENT DOCUMENTS

2009/0311979 A1* 12/2009 Husted .................... H03C 5/00
455/102
2010/0135437 A1 6/2010 Lee et al.

FOREIGN PATENT DOCUMENTS

| | | |
|---|---|---|
| JP | 2012-195929 A | 10/2012 |
| JP | 2013-230014 A | 11/2013 |
| KR | 10-2006-0046981 | 5/2006 |
| KR | 10-0752585 B1 | 8/2007 |
| KR | 10-2010-0063654 | 6/2010 |

OTHER PUBLICATIONS

Notice to Submit Response issued in the Korean Patent Office dated Jan. 23, 2017, along with an English translation thereof.

* cited by examiner

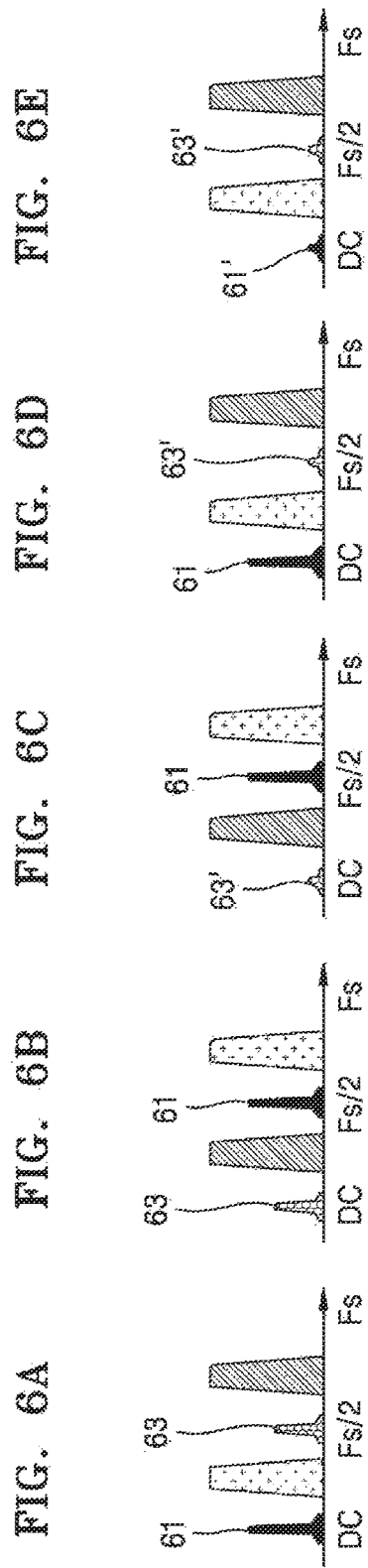

APPARATUS AND METHOD FOR PROCESSING OUTPUT SIGNAL OF ANALOG-TO-DIGITAL CONVERTER

CROSS-REFERENCE TO RELATED APPLICATIONS

This application is a National Stage of International Application No. PCT/KR2015/014450, filed Dec. 29, 2015, and claims priority from Korean Patent Application No. 10-2014-0192229, filed Dec. 29, 2014, the contents of which are incorporated herein by reference in their entireties.

BACKGROUND

1. Field

The inventive concept relates to an apparatus and method for processing an output signal of an analog-digital converter, and more particularly, to an apparatus and method for processing an output signal of an analog-digital converter, whereby direct current components and spurious components included in the output signal of the analog-digital converter can be easily eliminated.

2. Description of the Related Art

In general, equipment, such as a relay device or distributed antenna system, is used to extend a service area of a base station or to remove a shadow region in a mobile communication system. Recently, for various reasons such as a reduction in the effect caused by noise, a reduction in a transmission capacity, and ease of signal processing, research into a digital relay device, a digital distributed antenna system, or the like, which performs digital processing on received base station signals and then transmits the signals to a user terminal, has been briskly carried out.

An analog-digital converter is used to extract digital signals from received radio frequency (RF) signals in such the digital relay device, the digital distributed antenna system, or the like. The analog-digital converter is a device for converting an analog input into digital signals according to a sampling frequency and outputting the digital signals.

In an existing analog-digital converter, direct current components may be included in digital signals converted and output due to the effect caused by direct current power provided so as to drive the analog-digital converter. Also, in the existing analog-digital converter, spurious components are generated in a frequency band corresponding to ½ of a sampling frequency used in signal conversion. The direct current components and the spurious components included in the converted digital signals are included in the whole output of the digital relay device or the digital distributed antenna system, which may cause service deterioration such as signal distortion. In particular, it is not easy to eliminate the spurious components generated in a ½ band of the sampling frequency.

SUMMARY

The inventive concept is directed to providing an apparatus and method for processing an output signal of an analog-digital converter, whereby direct current components and spurious components included in an output of the analog-digital converter can be easily eliminated.

According to an aspect of the inventive concept, there is provide an apparatus for processing an output signal of an analog-digital converter, the apparatus includes a first frequency conversion unit for converting a frequency of the output signal of the analog-digital converter so that a band where spurious components exist moves to a band where direct current components exist in the output signal of the analog-digital converter; a spurious component blocking unit for eliminating, from an output signal of the first frequency conversion unit, spurious components which have moved to the band where direct current components exist; and a second frequency conversion unit for restoring a frequency of an output signal of the spurious component blocking unit to the original frequency of the output signal of the analog-digital converter.

According to an exemplary embodiment, the apparatus may further include a direct current component blocking unit disposed at a front end of the first frequency conversion unit and for eliminating direct current components from the output signal of the analog-digital converter.

According to an exemplary embodiment, the apparatus may further include a direct current component blocking unit disposed at a rear end of the second frequency conversion unit and for eliminating direct current components from an output signal of the second frequency conversion unit.

According to an exemplary embodiment, the band where the spurious components exist, may be a ½ band of a sampling frequency of the analog-digital converter.

According to an exemplary embodiment, the direct current component blocking unit and the spurious component blocking unit may be implemented with at least one of a digital high pass filter, a digital band eliminating filter, and a processing logic, which are used to eliminate direct current components.

According to another aspect of the inventive concept, there is provide a method for processing an output signal of an analog-digital converter, the method includes converting a frequency of the output signal of the analog-digital converter so that a band where spurious components exist moves to a band where direct current components exist in the inputted analog-digital converter output signal; eliminating, from the output signal of the analog-digital converter having a converted frequency, spurious components which have moved to the band where direct current components exist; and restoring a frequency of the output signal of the analog-digital converter from which the spurious components are eliminated, to the original frequency of the output signal of the analog-digital converter.

According to an exemplary embodiment, the method may further include, before the converting of the frequency of the output signal of the analog-digital converter, eliminating direct current components from the output signal of the analog-digital converter.

According to an exemplary embodiment, the method may further include, after the restoring of the frequency of the output signal of the analog-digital converter to the original frequency of the output signal of the analog-digital converter, eliminating direct current components from the output signal of the analog-digital converter having the frequency restored to the original frequency thereof.

According to an exemplary embodiment, the eliminating of the spurious components and the eliminating of the direct current components may be performed by a single digital filter.

According to an exemplary embodiment, the band where the spurious components exist, may be a ½ band of a sampling frequency of the analog-digital converter.

According to embodiments of the inventive concept, spurious components that exist in an analog-digital converter can be easily eliminated by simple frequency conversion without including an additional filter.

In addition, according to embodiments of the inventive concept, the whole output of a system to which the analog-digital converter is applied (for example, a digital relay device, a digital distributed antenna system), is prevented from being distorted so that communication services of excellent quality can be provided.

BRIEF DESCRIPTION OF THE FIGURES

A brief description of the drawings is provided to more sufficiently understand the drawings recited in a detailed description.

FIGS. 6A to 6E are views of signals output from each of components illustrated in FIG. 4 in a frequency region.

DETAILED DESCRIPTION OF EXEMPLARY EMBODIMENTS

Figure 1:
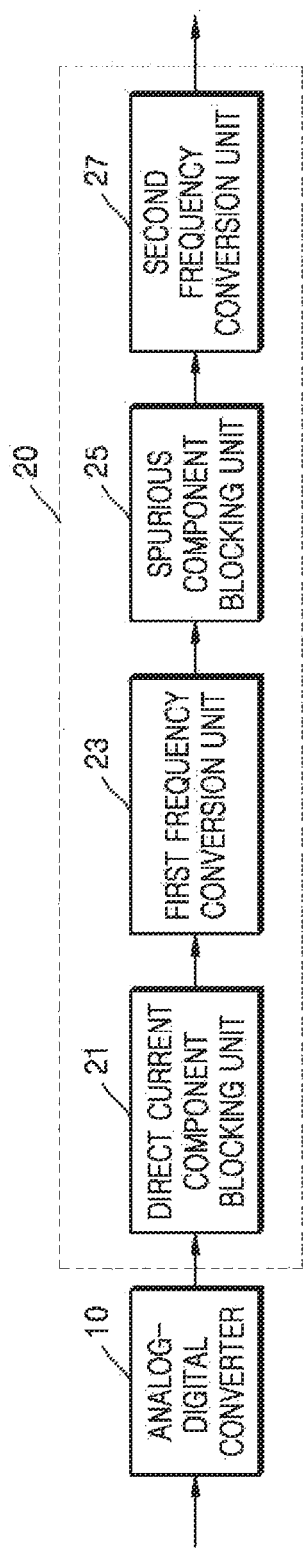
FIG. 1 is a block diagram of an apparatus for processing an output signal of an analog-digital converter according to an embodiment of the inventive concept.

As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the scope of the inventive concept are encompassed in the inventive concept.

In the description of the inventive concept, certain detailed explanations of related art are omitted when it is deemed that they may unnecessarily obscure the essence of the invention. In addition, numbers (for example, first, second, etc.) used during describing of the present specification are just identification symbols for distinguishing one component from another.

In addition, it will be understood that when an element is referred to as being "connected to" or "coupled to" another element, the element can be directly connected to or directly coupled to another element or intervening elements, unless specially otherwise defined.

Hereinafter, embodiments of the inventive concept will be described in detail with reference to the attached drawings.

FIG. 1 a block diagram of an apparatus for processing an output signal of an analog-digital converter according to an embodiment of the inventive concept.

Referring to FIG. 1, an apparatus 20 for processing an output signal of an analog-digital converter according to an embodiment of the inventive concept may include a direct current component blocking unit 21, which eliminates (for example, DC blocks) direct current components from an output signal of an analog-digital converter 10, a first frequency conversion unit 23, which converts a frequency of an output signal of the direct current component blocking unit 21 so that a band where spurious signals exist, moves to a band where the direct current components exist, a spurious component blocking unit 25, which eliminates spurious components that have moved to the band where the direct current components exist, from an output signal of the first frequency conversion unit 23, and a second frequency conversion unit 27, which restores an output signal of the spurious component blocking unit 25 to an original frequency of the output signal of the analog-digital converter 10.

The output signal of the analog-digital converter 10 is inputted into the direct current component blocking unit 21, and the direct current component blocking unit 21 eliminates direct current components from the inputted signal. The direct current component blocking unit 21 may be implemented with a kind of digital high pass filter (HPF) or digital band removing filter (BRF) implemented on a signal line. According to an implementation example, the direct current component blocking unit 21 may be implemented with a processing logic for eliminating direct current components in addition to a filter. The processing logic may be a logic for detecting direct current components included in an inputted signal according to an algorithm such as a moving average method, for example, and eliminating the detected direct current components.

Meanwhile, the spurious component blocking unit 25 is also an element having substantially the same function as that of the direct current component blocking unit 21. In the embodiment illustrated in FIG. 1, the direct current component blocking unit 21 and the spurious component blocking unit 25 are separately illustrated for functional classification. However, in an actual implementation, the direct current component blocking unit 21 and the spurious component blocking unit 25 may be implemented with a single component, for example, a single digital filter as in the above-described example.

The first frequency conversion unit 23 converts the frequency of the output signal of the direct current component blocking unit 21 so that a band where spurious signals exist, for example, in the output signal of the analog-digital converter 10, a frequency band corresponding to ½ of a sampling frequency Fs moves to a band where direct current components exist. The first frequency conversion unit 23 may be implemented with a digital frequency converter well-known in the technical field.

The spurious component blocking unit 25 blocks a frequency band corresponding to the direct current components from a signal output from the first frequency conversion unit 23. Because the frequency band Fs/2 where the spurious components of the analog-digital converter 10 exist, has moved to the band where the direct current components exist, by the first frequency conversion unit 23, the spurious component blocking unit 25 eliminates the spurious components substantially.

The second frequency conversion unit 25 may restore the output signal of the spurious component blocking unit 25 to an original frequency of the output signal of the analog-digital converter 10.

Figure 2:
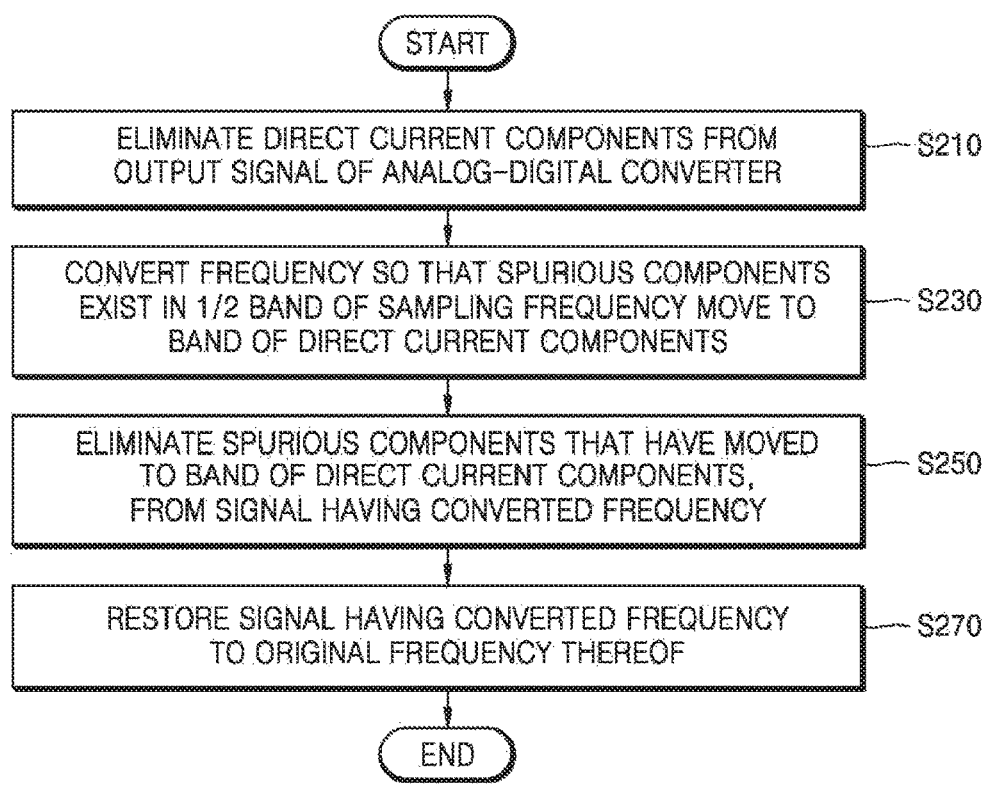
FIG. 2 is a flowchart for describing an operation of the apparatus for processing the output signal of the analog-digital converter according to an embodiment of the inventive concept.
Figure 3:
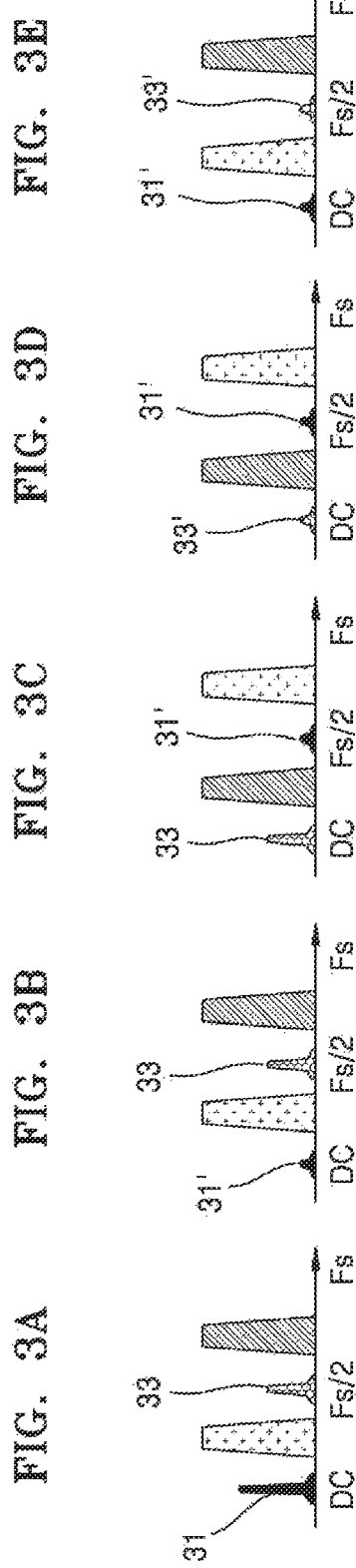
FIGS. 3A to 3E are views of signals output from each of components illustrated in FIG. 1 in a frequency region.

FIG. 2 is a flowchart for describing an operation of the apparatus for processing the output signal of the analog-digital converter according to an embodiment of the inventive concept. Also, FIGS. 3A to 3E are views of signals output from each of components illustrated in FIG. 1 in a frequency region.

Hereinafter, the operation and effects of the apparatus for processing the output signal of the analog-digital converter according to an embodiment of the inventive concept will be described with reference to FIGS. 1 through 3E. Descriptions of a method for processing an output signal of an analog-digital converter according to an embodiment of the inventive concept could have been replaced with descriptions of the operation of the apparatus for processing the output signal of the analog-digital converter according to an embodiment of the inventive concept with reference to FIG. 2.

First, in an apparatus 20 for processing an output signal of an analog-digital converter according to an embodiment of the inventive concept, a signal output from the analog-digital converter 10 is inputted into the direct current component blocking unit 21, and the direct current component blocking unit 21 eliminates direct current components from the inputted signal (see S210 of FIG. 2). As illustrated in FIG. 3A, in the output signal of the analog-digital converter 10, direct current components 31 exist in a low frequency band, and spurious components 33 exist in a ½ frequency band of the sampling frequency Fs applied to the analog-digital converter 10. When a signal having the frequency characteristics as illustrated in FIG. 3A is inputted into the direct current component blocking unit 21, the direct current components are eliminated from the signal so that a signal illustrated in FIG. 3B can be outputted. The direct current components eliminated in FIG. 3B are indicated by reference numeral 31'.

Subsequently, an output signal of the direct current component blocking unit 21 is inputted into the first frequency conversion unit 23, and the first frequency conversion unit 23 converts the frequency of the inputted signal so that spurious components 33 that exist in the ½ frequency band of the sampling frequency Fs moves to a frequency band where direct current components exist (see S230 of FIG. 2). As illustrated in FIG. 3C, through frequency conversion using the first frequency conversion unit 23, in the inputted signal, the spurious components 33 that exist in the ½ frequency band of the sampling frequency Fs, move to the frequency band where the direct current components exist, and the eliminated direct current components 31' move to the ½ frequency band of the sampling frequency Fs.

Subsequently, an output signal of the first frequency conversion unit 23 is inputted into the spurious component blocking unit 25, and the spurious component blocking unit 25 eliminates components of a frequency band (a frequency band corresponding to a direct current) where spurious components exist, from the inputted signal (see S250 of FIG. 2). As illustrated in FIG. 3D, the spurious components that have moved to the band where the direct current components exist, by the first frequency conversion unit 23 are eliminated by the spurious component blocking unit 25. Thus, the direct current components that have existed in the signal output from the analog-digital converter 10, and the spurious components that have existed in the ½ band of the sampling frequency Fs are eliminated. The spurious components eliminated in FIG. 3D are indicated by reference numeral 33'.

Subsequently, an output signal of the spurious component blocking unit 25 is inputted into the second frequency conversion unit 27, and the second frequency conversion unit 27 restores the inputted signal to an original frequency thereof and outputs a signal having the same frequency as that of the signal output from the analog-digital converter 10. That is, the second frequency conversion unit 27 converts the frequency of the inputted signal into the original frequency of the signal output from the analog-digital converter 10, thereby outputting a signal having the same frequency as that of the signal output from the analog-digital converter 10 (see S270 of FIG. 2). As illustrated in FIG. 3E, an output signal of the apparatus 20 for processing the output signal of the analog-digital converter according to an embodiment of the inventive concept is a signal obtained by eliminating direct current components and spurious components from the output signal of the analog-digital converter 10.

As described above, in the apparatus 20 for processing the output signal of the analog-digital converter according to an embodiment of the inventive concept, spurious components that exist in the output signal of the analog-digital converter can be easily eliminated by simple frequency conversion without including an additional filter. Thus, the whole output of a system to which the analog-digital converter is applied (for example, a digital relay device, a digital distributed antenna system, etc.), is prevented from being distorted so that communication services of excellent quality can be provided.

Figure 4:
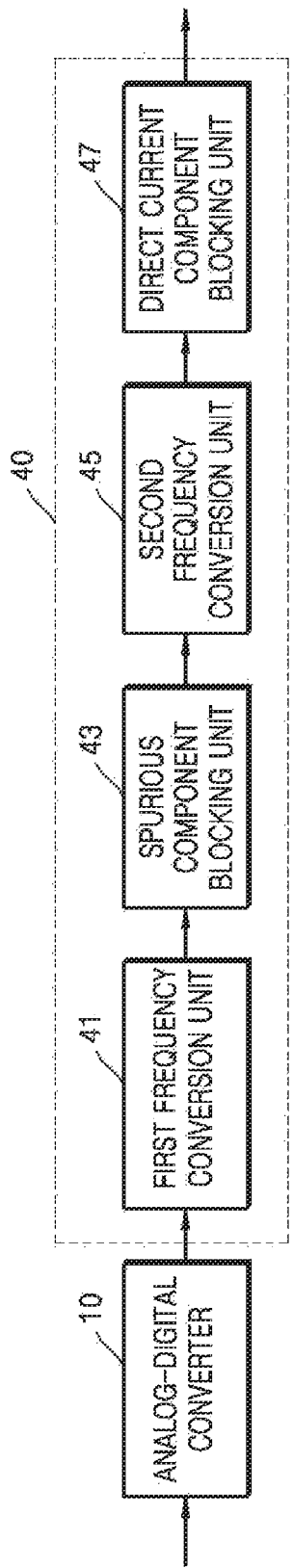
FIG. 4 is a block diagram of an apparatus for processing an output signal of an analog-digital converter according to an embodiment of the inventive concept.

FIG. 4 is a block diagram of an apparatus for processing an output signal of an analog-digital converter according to an embodiment of the inventive concept. Because an apparatus 40 for processing an output signal of an analog-digital converter illustrated in FIG. 4 represents another implementation example of the apparatus 20 for processing the output signal of the analog-digital converter illustrated in FIG. 1, hereinafter, for conveniences of explanation, redundant descriptions with FIG. 1 will be omitted, and only differences therebetween will be provided.

Referring to FIG. 4, the apparatus 40 for processing the output signal of the analog-digital converter according to an embodiment of the inventive concept may include a first frequency conversion unit 41, which converts the frequency of an output signal of the analog-digital converter 10 so that a band where spurious signals exist, moves to a band where direct current components exist, a spurious component blocking unit 43, which eliminates spurious components that have moved to the band where the direct current components exist, from an output signal of the first frequency conversion unit 41, a second frequency conversion unit 45, which restores an output signal of the spurious component blocking unit 43 to an original frequency of the output signal of the analog-digital converter 10, and a direct current component blocking unit 47, which eliminates direct current components from an output signal of the second frequency conversion unit 45.

In the apparatus 40 for processing the output signal of the analog-digital converter illustrated in FIG. 4, unlike the apparatus 20 for processing the output signal of the analog-digital converter illustrated in FIG. 1, the direct current component blocking unit 47, which eliminates the direct current components included in the output signal of the analog-digital converter 10, is disposed at a last end based on a signal path. That is, according to the inventive concept, a direct current component blocking unit that is a configuration for eliminating direct current components included in an output signal of an analog-digital converter is disposed not only at a front end of frequency conversion units and a spurious component blocking unit for blocking spurious components but also at a rear end of the frequency conversion units and the spurious component blocking unit. However, the inventive concept is not limited thereto, and according to an implementation example, the direct current component blocking unit may also be disposed between the frequency conversion units and the spurious component blocking unit for blocking the spurious components.

Figure 5:
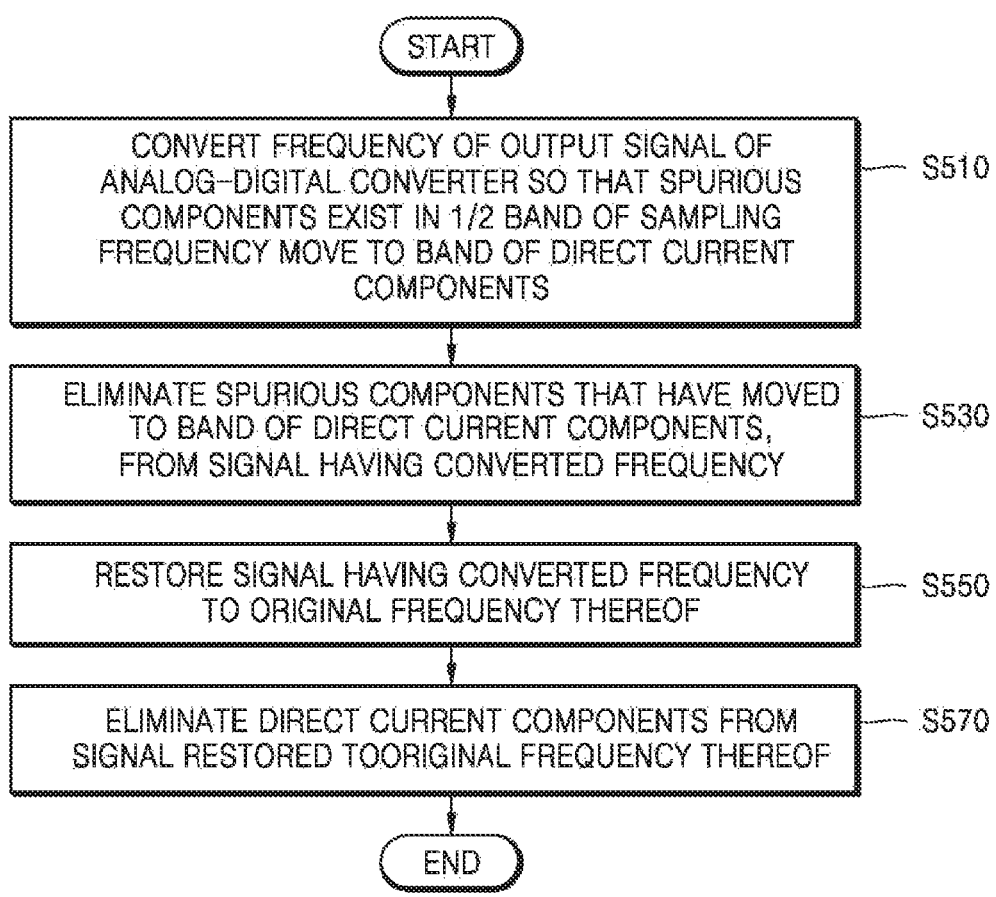
FIG. 5 is a flowchart for describing an operation of the apparatus for processing the output signal of the analog-digital converter according to an embodiment of the inventive concept.

FIG. 5 is a flowchart for describing an operation of the apparatus for processing the output signal of the analog-digital converter according to an embodiment of the inventive concept. Also, FIGS. 6A to 6E are views of signals output from each of components illustrated in FIG. 4 in a frequency region.

Hereinafter, the operation and effects of the apparatus for processing the output signal of the analog-digital converter according to an embodiment of the inventive concept will be described with reference to FIGS. 4 through 6E. Descriptions of a method for processing an output signal of an analog-digital converter according to an embodiment of the inventive concept would have been replaced with descriptions of the operation of the apparatus for processing the output signal of the analog-digital converter according to an embodiment of the inventive concept with reference to FIG. 5. Meanwhile, in the description of FIGS. 5 through 6E, for conveniences of explanation, redundant descriptions with FIGS. 2 through 3# will be omitted, and only differences therebetween will be provided.

First, in the apparatus 40 for processing the output signal of the analog-digital converter according to an embodiment of the inventive concept, a signal output from the analog-digital converter 10 is inputted into the first frequency conversion unit 41, and the first frequency conversion unit 41 converts the frequency of the inputted signal so that in the output signal of the analog-digital converter, spurious components 63 that exist in a ½ frequency band of the sampling frequency Fs move to a frequency band where direct current components exist (S510 of FIG. 5). As illustrated in FIG. FIG. 6A, direct current components 61 exist in a low frequency band of the output signal of the analog-digital converter 10, and the spurious components 63 exist in the ½ frequency band of the sampling frequency Fs applied to the analog-digital converter 10. When the signal having frequency characteristics illustrated in FIG. 6A is inputted into the first frequency conversion unit 41, the frequency of the signal is converted, and the spurious components 63 that exist in the ½ frequency band of the sampling frequency Fs move to the frequency band where the direct current components exist, and the direct current components 61 move to the ½ frequency band of the sampling frequency Fs, as illustrated in FIG. 6B.

Subsequently, an output signal of the first frequency conversion unit 41 is inputted into the spurious component blocking unit 43, and the spurious component blocking unit 43 eliminates components of the frequency band where the spurious components exist, from the inputted signal having a converted frequency (see S530 of FIG. 5). As illustrated in FIG. 6C, the spurious components that have moved to the band where the direct current components exist, are eliminated by the spurious component blocking unit 43. Thus, the spurious components that exist in the ½ band of the sampling frequency Fs are eliminated from the signal output from the analog-digital converter 10. The spurious components eliminated in FIG. 6C are indicated by reference numeral 63'.

Subsequently, a signal output from the spurious component blocking unit 43 is inputted into the second frequency conversion unit 45, and the second frequency conversion unit 45 restores the inputted signal having the converted frequency to an original frequency thereof and outputs a signal having the same frequency as that of the signal output from the analog-digital converter 10 (see S550 of FIG. 5). That is, the second frequency conversion unit 45 converts the frequency of the inputted signal into the original frequency of the signal output from the analog-digital converter 10 and outputs a signal having the same frequency as that of the signal output from the analog-digital converter 10. Thus, as illustrated in FIG. 6D, the direct current components 61 included in the output signal of the analog-digital converter 10 and the eliminated spurious components 63' move to an original frequency band.

Subsequently, an output signal (for example, a signal restored to the original frequency) of the second frequency conversion unit 45 is inputted into the direct current component blocking unit 47, and the direct current component blocking unit 47 eliminates direct current components from the inputted signal restored to the original frequency thereof (see S570 of FIG. 5). Direct current components eliminated in FIG. 6 are indicated by reference numeral 61', and as illustrated in FIG. 6E, an output signal of the apparatus 40 for processing the output signal of the analog-digital converter according to an embodiment of the inventive concept is a signal obtained by eliminating direct current components and spurious components from the output signal of the analog-digital converter 10.

As described above, the apparatus 40 for processing the output signal of the analog-digital converter according to an embodiment of the inventive concept, similarly to the apparatus 20 for processing the output signal of the analog-digital converter illustrated in FIG. 1, can easily eliminate spurious components that exist in the output signal of the analog-digital converter without including an additional filter through simple frequency conversion. Thus, the entire output of a system to which the analog-digital converter is applied (for example, a digital relay device, a digital distributed antenna system, etc.) can be prevented from being distorted so that communication services of excellent quality can be guaranteed.

While the inventive concept has been shown and described with reference to certain exemplary embodiments thereof, it will be understood by those skilled in the art that various changes in form and details may be made therein without departing from the scope of the inventive concept as defined by the appended claims.

The invention claimed is:

1. An apparatus for processing an output signal of an analog-digital converter, the apparatus comprising:
   a first frequency conversion unit for converting a frequency of the output signal of the analog-digital converter so that spurious components of a second band move to a first band and direct current components of the first band move to the second band;
   a spurious component blocking unit for eliminating the moved spurious components of the first band from an output signal of the first frequency conversion unit; and
   a second frequency conversion unit for restoring a frequency of an output signal of the spurious component blocking unit to an original frequency of the output signal of the analog-digital converter.

2. The apparatus of claim 1, further comprising a direct current component blocking unit disposed at a front end of the first frequency conversion unit and for eliminating the direct current components from the output signal of the analog-digital converter.

3. The apparatus of claim 2, wherein the direct current component blocking unit and the spurious component blocking unit are implemented with at least one of a digital high pass filter, a digital band eliminating filter, and a processing logic, which are used to eliminate direct current components.

4. The apparatus of claim 1, further comprising a direct current component blocking unit disposed at a rear end of the second frequency conversion unit and for eliminating the direct current components from an output signal of the second frequency conversion unit.

5. The apparatus of claim 1, wherein the second band where the spurious components exist, is a ½ band of a sampling frequency of the analog-digital converter.

6. A method for processing an output signal of an analog-digital converter, the method comprising:
   converting a frequency of the output signal of the analog-digital converter so that spurious components of a second band move to a first band and direct current components of the first band move to the second band;
   eliminating the moved spurious components of the first band from the output signal of the analog-digital converter having a converted frequency; and
   restoring a frequency of the output signal of the analog-digital converter from which the spurious components are eliminated, to an original frequency of the output signal of the analog-digital converter.

7. The method of claim 6, further comprising, before the converting of the frequency of the output signal of the analog-digital converter, eliminating the direct current components from the output signal of the analog-digital converter.

8. The method of claim 7, wherein the eliminating of the spurious components and the eliminating of the direct current components are performed by at least one digital filter having substantially the same function.

9. The method of claim 6, further comprising, after the restoring of the frequency of the output signal of the analog-digital converter to the original frequency of the output signal of the analog-digital converter, eliminating the direct current components from the output signal of the analog-digital converter having the frequency restored to the original frequency thereof.

10. The method of claim 6, wherein the second band where the spurious components exist, is a ½ band of a sampling frequency of the analog-digital converter.

* * * * *